(12) United States Patent
Akagawa et al.

(10) Patent No.: US 8,928,007 B2
(45) Date of Patent: Jan. 6, 2015

(54) ELECTRO-OPTICAL DEVICE, METHOD FOR MANUFACTURING ELECTRO-OPTICAL DEVICE, AND ELECTRONIC DEVICE

(75) Inventors: Suguru Akagawa, Suwa (JP); Yuki Hanamura, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 357 days.

(21) Appl. No.: 13/093,514

(22) Filed: Apr. 25, 2011

(65) Prior Publication Data

US 2011/0260204 A1 Oct. 27, 2011

(30) Foreign Application Priority Data

Apr. 27, 2010 (JP) ................................. 2010-101773

(51) Int. Cl.
H01L 27/15 (2006.01)
H01L 27/32 (2006.01)
H01L 51/52 (2006.01)

(52) U.S. Cl.
CPC ........ H01L 27/3276 (2013.01); H01L 27/3246 (2013.01); H01L 27/3223 (2013.01); H01L 51/5253 (2013.01); H01L 2227/323 (2013.01)
USPC .......... 257/81; 257/91; 257/98; 257/E31.095; 438/22; 438/28

(58) Field of Classification Search
None
See application file for complete search history.

(56) References Cited

U.S. PATENT DOCUMENTS

| 7,038,377 | B2 | 5/2006 | Kobayashi et al. | |
| 7,053,548 | B2 | 5/2006 | Nakanishi | |
| 7,786,668 | B2 | 8/2010 | Hayashi | |
| 2003/0089991 | A1 | 5/2003 | Yamazaki et al. | |
| 2003/0227021 | A1 | 12/2003 | Yamazaki et al. | |
| 2006/0006424 | A1 | 1/2006 | Yamazaki et al. | |
| 2007/0114521 | A1* | 5/2007 | Hayashi et al. | 257/40 |
| 2009/0115321 | A1* | 5/2009 | Hayashi | 313/504 |
| 2009/0256467 | A1 | 10/2009 | Yamazaki et al. | |
| 2010/0201662 | A1 | 8/2010 | Yamazaki et al. | |
| 2011/0180801 | A1 | 7/2011 | Yamazaki et al. | |
| 2012/0228643 | A1 | 9/2012 | Yamazaki et al. | |

FOREIGN PATENT DOCUMENTS

| JP | A-2004-047411 | 2/2004 |
| JP | A-2004-063461 | 2/2004 |
| JP | A-2005-322639 | 11/2005 |
| JP | A-2007-147814 | 6/2007 |
| JP | A-2009-117079 | 5/2009 |
| JP | A-2009-193754 | 8/2009 |
| WO | WO 03/060858 A1 | 7/2003 |

OTHER PUBLICATIONS

WebElements Data on resistivity, 2013.*

* cited by examiner

*Primary Examiner* — Tan N Tran
*Assistant Examiner* — Scott R Wilson
(74) *Attorney, Agent, or Firm* — Oliff PLC

(57) ABSTRACT

An electro-optical device includes: a pixel region that is formed on a substrate and in which a light emitting element that has a first electrode, a second electrode and a light emitting layer formed between the first electrode and the second electrode is arranged; a partition wall portion that is formed above the substrate and located on an outer side of the pixel region; a connecting line that is formed above the substrate and located on an outer side of the partition wall portion; and a connecting section that is formed above the substrate and electrically connects the second electrode to the connecting line, wherein the second electrode covers and extends over the pixel region and the partition wall portion and does not overlap the connecting line in a planar view.

20 Claims, 11 Drawing Sheets

ELECTRO-OPTICAL DEVICE, METHOD FOR MANUFACTURING ELECTRO-OPTICAL DEVICE, AND ELECTRONIC DEVICE

BACKGROUND

1. Technical Field

The present invention relates to an electro-optical device, a method for manufacturing an electro-optical device and an electronic device.

2. Related Art

As an electro-optical device, an organic electroluminescence (EL) device is known, which has an organic EL element that is formed on a substrate and has a pair of electrodes and a functional layer. The functional layer has a light emitting layer constituted by an organic film and is located between the pair of electrodes.

The emission lifetime of the organic EL device may be reduced when the function layer absorbs moisture or gas. Thus, the organic EL device has a sealing structure that protects the organic EL element from moisture or gas flowing into the inside of the device from outside the device.

For example, International Publication No. 2003/60858 discloses a display device that includes: a substrate that has a wiring layer and a plurality of display elements separated by a bank layer; and a sealing substrate that joins an outer circumferential sealing region of the substrate and covers the substrate. In the sealing region, an outer circumferential portion of an electrode layer that covers the plurality of display elements and the bank layer is connected to the wiring layer. The display device has a so-called can sealing structure that seals the substrate provided with the display elements at portions located along four sides of the sealing substrate. The electrode layer is connected to the wiring layer in the sealing region. Thus, International Publication No. 2003/60858 describes that a frame region that does not contribute to displaying can be narrowed compared with a structure in which the position of the sealing region is different from the position of a connection region (in which the electrode layer is connected to the wiring layer) in a planar view.

In addition, JP-A-2009-117079 discloses an organic EL device that includes: a first connecting line that is arranged around a display region and connected to one of a pair of electrodes between which an organic light emitting layer is provided; and a gas barrier layer that covers an edge surface and front surface of the first connecting line and surfaces of multiple light emitting elements arranged in the display region. JP-A-2009-117079 describes that the gas barrier layer of the organic EL device prevents moisture from flowing into the inside of the device through the first connecting line and the organic EL device has a long emission lifetime.

However, when the technical idea described in JP-A-2009-117079 is reflected in the sealing structure described in International Publication No. 2003/60858, the width of the frame region included in the display device disclosed in International Publication No. 2003/60858 may need to be increased. Thus, there is a problem that it is difficult to accomplish the desired purpose of reducing the width of the frame region.

SUMMARY

The invention has been devised to solve at least a part of the aforementioned problem and can be achieved by the following embodiments or aspects of the invention.

An electro-optical device according to an aspect of the invention includes: a pixel region that is formed on a substrate and in which a light emitting element that has a first electrode, a second electrode and a light emitting layer formed between the first electrode and the second electrode is arranged; a partition wall portion that is formed above the substrate and located on an outer side of the pixel region; a connecting line that is formed above the substrate and located on an outer side of the partition wall portion; and a connecting section that is formed above the substrate and electrically connects the second electrode to the connecting line, wherein the second electrode covers and extends over the pixel region and the partition wall portion and does not overlap the connecting line in a planar view.

According to this configuration, the connecting line and the second electrode are electrically connected to each other through the connecting section. Thus, even when the accuracy of the arrangement of the second electrode in the planar view is low compared with a structure in which the connecting line and the second electrode contact each other and are directly connected to each other, the connecting section is formed in consideration of the low accuracy of the arrangement, and the connecting line and the second electrode can be electrically connected to each other in a stable manner. In other words, it is possible to narrow a region that is located outside the pixel region and in which the connecting line and the second electrode are electrically connected to each other.

In the electro-optical device according to the aspect of the invention, the partition wall portion may include an outer part that has a side surface that faces toward an outer circumference of the substrate, and the second electrode may overlap the connecting section on the outer part of the partition wall portion in the planar view.

According to this configuration, even when a region in which the partition wall portion that surrounds the pixel region is arranged is narrow in the planar view, the connecting section and the second electrode can be electrically connected to each other in a stable manner using the wall surface of the partition wall portion.

The electro-optical device according to the aspect of the invention may further include a peripheral circuit that is arranged between the connecting line and the pixel region in the planar view and drives and controls the light emitting element, wherein at least a part of the connecting section overlaps the peripheral circuit in the planar view.

According to this configuration, even when the connecting line and the peripheral circuit are formed on the substrate in a frame region located outside the pixel region, the frame region can be narrowed by causing at least a part of the connecting section to overlap a region in which the peripheral circuit is arranged, compared with a structure in which the connecting section is independently arranged in the planar view.

In the electro-optical device according to the aspect of the invention, the connecting line and the connecting section preferably extend along a first side of the substrate and a second side of the substrate, the first and second sides of the substrate forming an outer circumference of the substrate and facing each other.

According to this configuration, it is possible to reduce electrical resistance of the second electrode in a direction and reduce a variation in a light emission characteristic of the light emitting element. In this case, it is preferable that the direction be a longitudinal direction of the second electrode. It is possible to suppress an increase in resistance of the second electrode in the longitudinal direction.

In the electro-optical device according to the aspect of the invention, the connecting section may be made of a conductive material and the second electrode may be made of a conductive material that is different from the conductive material of the connecting section.

According to this configuration, it is considered that the material of the second electrode can be selected from among various materials on the basis of how light emitted by the light emitting layer is extracted. However, the material of the second electrode does not limit a selection of the material of the connecting section since any conductive material can be selected as the material of the connecting section as long as the connecting section achieves the electrical connection.

In the electro-optical device according to the aspect of the invention, specific resistance of the connecting section is preferably smaller than specific resistance of the second electrode.

According to this configuration, the connecting line and the second electrode can be connected to each other through the connecting section that has low resistance.

The electro-optical device according to the aspect of the invention preferably has a gas barrier layer that covers the second electrode and the connecting section.

According to this configuration, the gas barrier layer prevents moisture and the like from flowing into the light emitting element arranged in the pixel region from an interface located above the substrate above which the connecting section is arranged. It is, therefore, possible to provide the electro-optical device that has a long emission lifetime.

According to another aspect of the invention, a method for manufacturing an electro-optical device that includes a light emitting element that is formed above a substrate and has a first electrode, a second electrode and a light emitting layer arranged between the first electrode and the second electrode includes: forming a partition wall portion on an outer side of a pixel region in which the light emitting element is arranged; forming a connecting line on an outer side of the partition wall portion; forming a connecting section that electrically connects the second electrode to the connecting line; and forming the second electrode so that the second electrode covers the pixel region and the partition wall portion and does not overlap the connecting line in a planar view.

According to this method, the connecting line and the second electrode are electrically connected to each other through the connecting section. Thus, even when the accuracy of the arrangement of the second electrode in the planar view is low compared with a structure in which the connecting line and the second electrode contact each other and are directly connected to each other, the connecting section is formed in consideration of the low accuracy of the arrangement, and the connecting line and the second electrode can be electrically connected to each other in a stable manner. In other words, it is possible to provide the method for manufacturing the electro-optical device that has a narrow region that is located outside the pixel region and in which the connecting line and the second electrode are electrically connected to each other.

In the method according to the other aspect of the invention, the connecting section may be formed using a photolithographic method, and the second electrode may be formed using a mask deposition method.

According to this method, even when the second electrode is formed using the mask deposition method that causes the accuracy of the position and shape of the second electrode to be low compared with the lithographic method, the accuracy of the position of a frame region that surrounds the pixel region in the electro-optical device is high. This is due to the fact that the connecting section that overlaps the second electrode is formed using the lithographic method.

In the method according to the other aspect of the invention, the partition wall portion may include an outer part that has a side surface that faces toward an outer circumference of the substrate, the connecting section may be formed and extend from the connecting line to the outer part of the partition wall portion in the planar view, and the second electrode may be formed and overlap the connecting section on the outer part of the partition wall portion in the planar view.

According to this method, even when a region in which the partition wall portion that surrounds the pixel region is formed is narrow in the planar view, the connecting section and the second electrode can be electrically connected to each other in a stable manner using the wall surface of the partition wall portion.

In the method according to the other aspect of the invention, the connecting section may be made of a conductive material, and the second electrode may be made of a conductive material that is different from the conductive material of the connecting section.

According to this method, the material of the second electrode and the material of the connecting section can be selected from among a larger number of materials, and the electro-optical device can support a top emission structure and a bottom emission structure.

In the method according to the other aspect of the invention, the connecting section may be made of the conductive material with lower specific resistance than the conductive material of the second electrode.

According to this method, it is possible to improve the accuracy of formation of a connection region and electrically connect the connecting line to the second electrode in a lower resistance state, compared with a structure in which the connecting line is directly connected to the second electrode.

The method according to the other aspect of the invention may further include forming a peripheral circuit that is arranged between the connecting line and the pixel region in the planar view and drives and controls the light emitting element, wherein the connecting section is formed so that at least a part of the connecting section overlaps the peripheral circuit in the planar view.

According to this method, even when the connecting line and the peripheral circuit are formed on the substrate in a frame region located outside the pixel region, the frame region can be narrowed by causing at least a part of the connecting section to overlap a region in which the peripheral circuit is arranged, compared with a structure in which the connecting section is independently arranged in the planar view.

The method according to the other aspect of the invention may further include forming a gas barrier layer that covers the second electrode and the connecting section.

According to this method, the gas barrier layer prevents moisture and the like from flowing into the light emitting element arranged in the pixel region from an interface located above the substrate above which the connecting section is arranged. It is, therefore, possible to manufacture the electro-optical device that has a long emission lifetime.

An electronic device according to still another aspect of the invention includes the electro-optical device according to the aspect of the invention or the electro-optical device manufactured using the method according to the other aspect of the invention.

According to this configuration, it is possible to narrow the frame region that surrounds the pixel region compared with a conventional technique and provide the electronic device that is compact and attractive.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
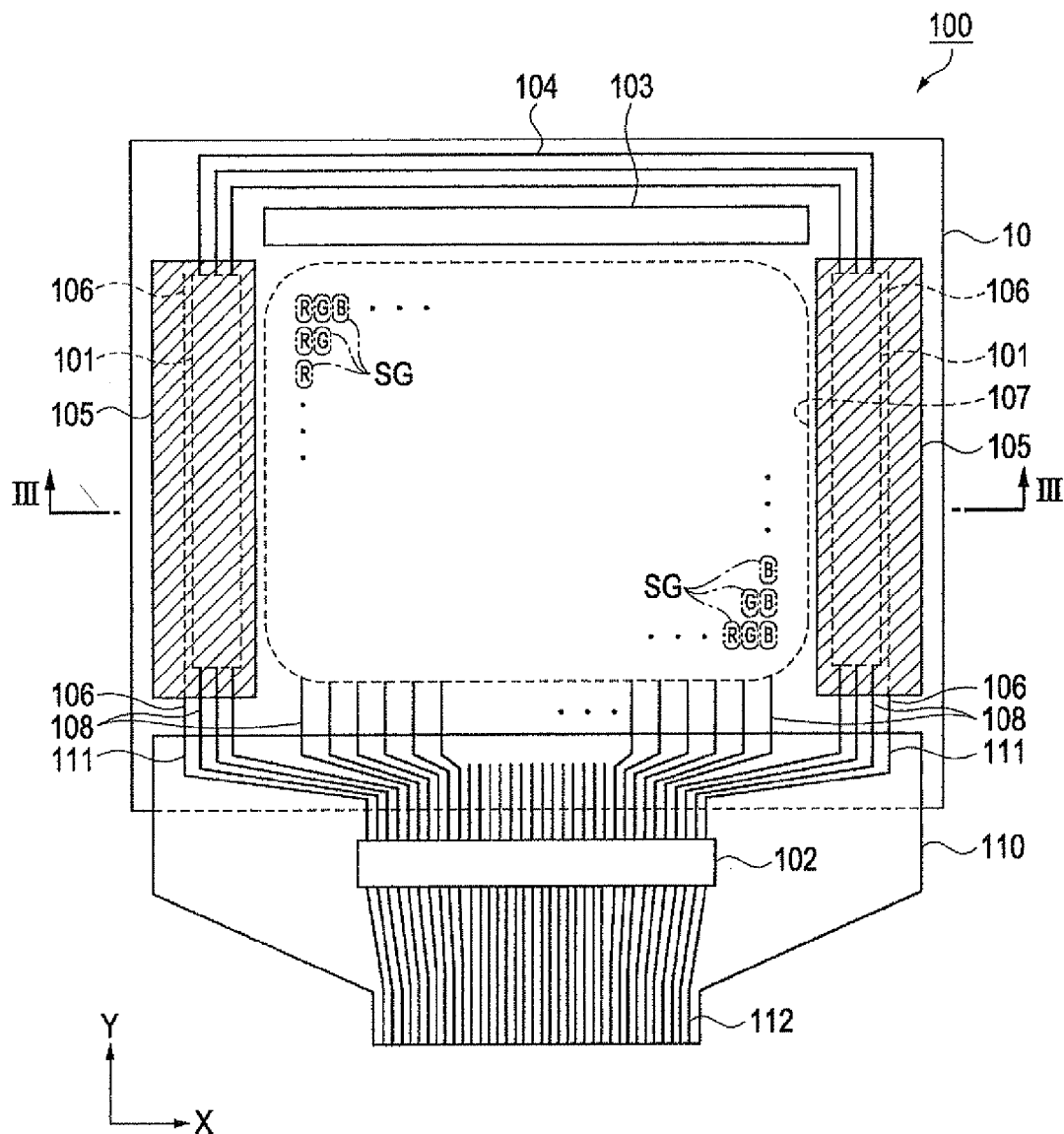
FIG. 1 is an outline plan view of a configuration of an electro-optical device.

Embodiments of the invention are described below with reference to the accompanying drawings. In the drawings, parts to be described are enlarged or reduced in order to recognize the parts.

First Embodiment

Electro-Optical Device

An electro-optical device according to a first embodiment of the invention is described with reference to FIGS. 1 to 4.

Figure 2:
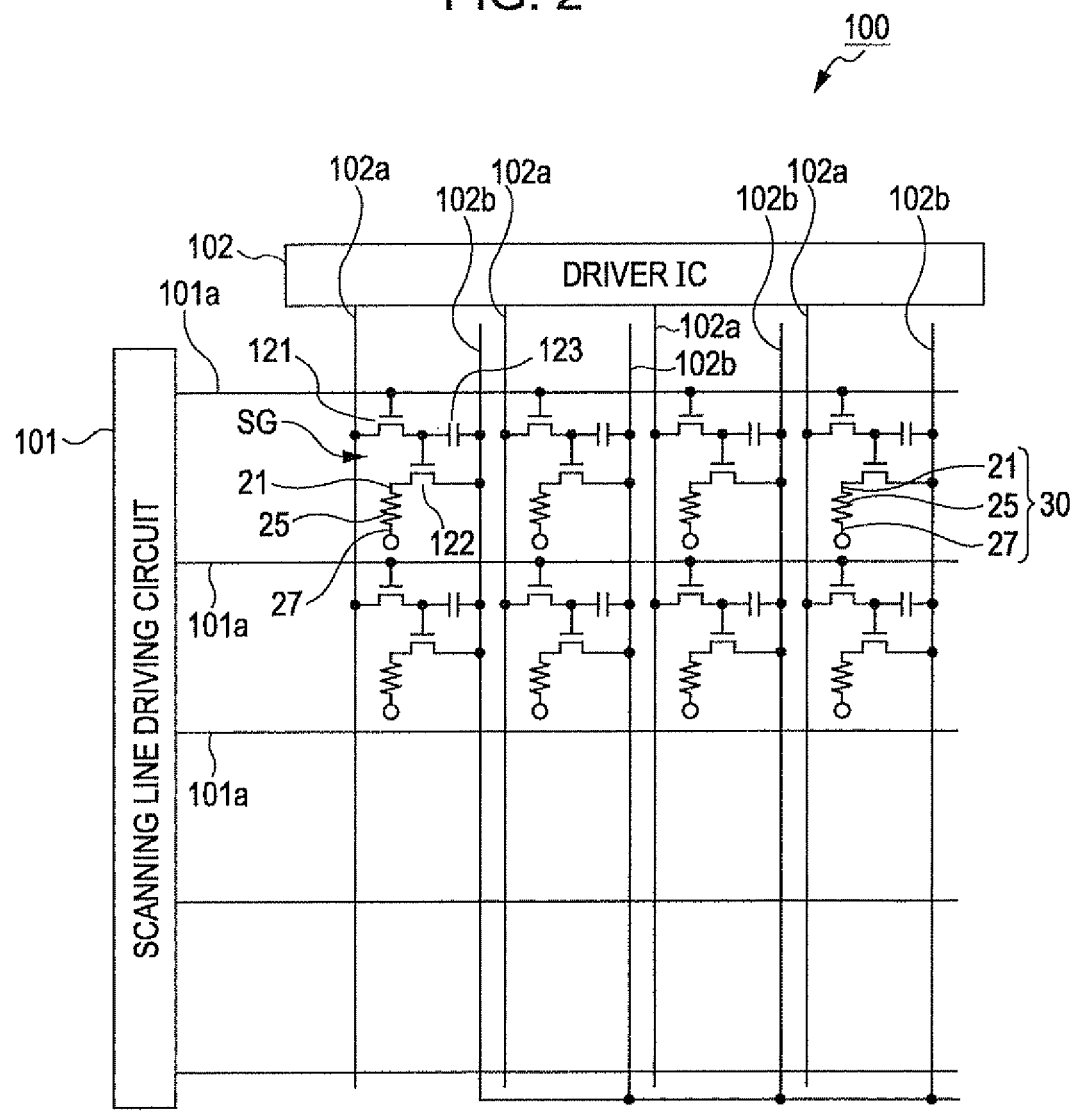
FIG. 2 is an equivalent circuit diagram showing an electrical configuration of the electro-optical device.
Figure 3:
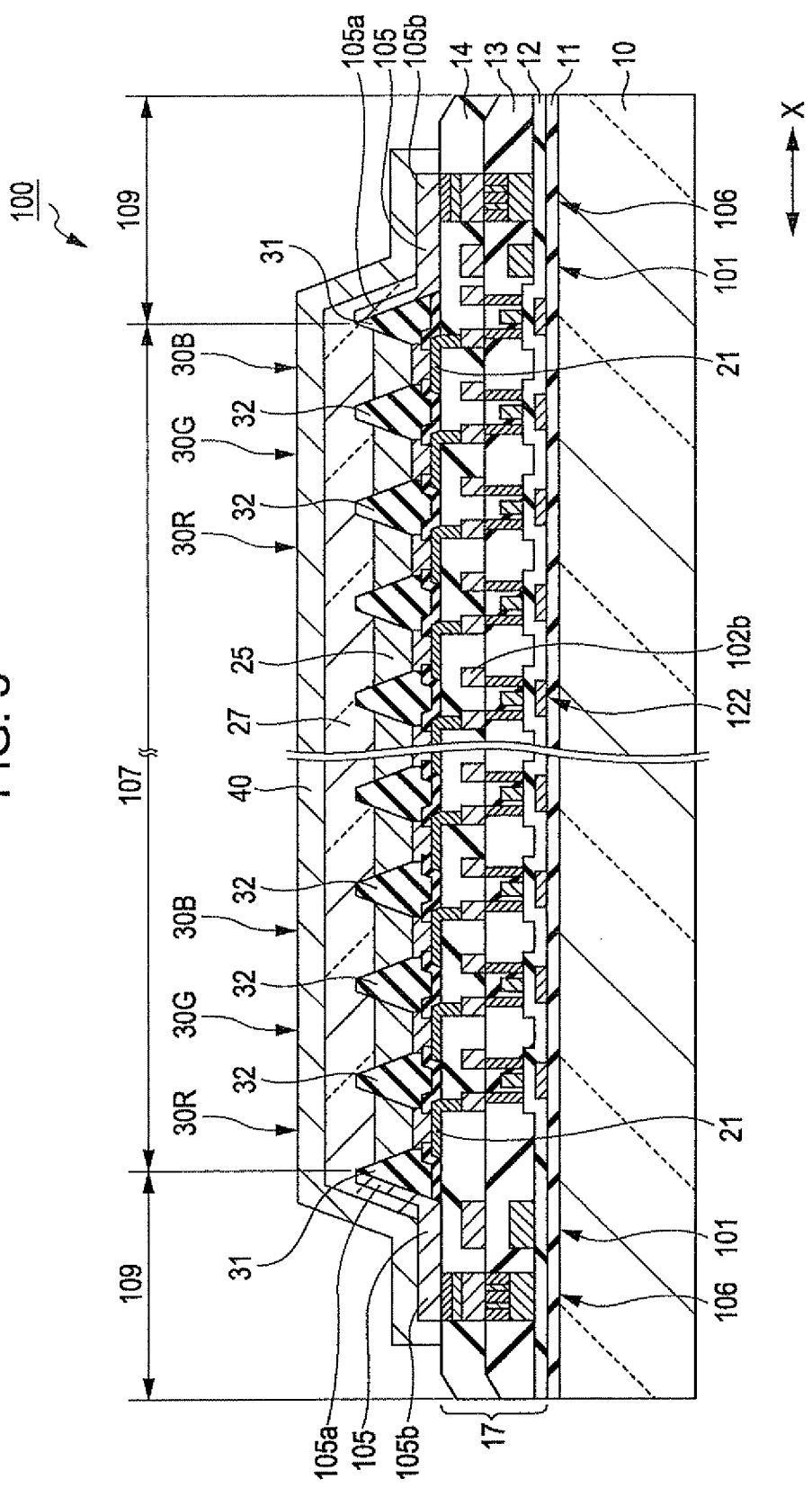
FIG. 3 is an outline cross-sectional view of a structure of the electro-optical device, taken along a line shown in FIG. 1.
Figure 4:
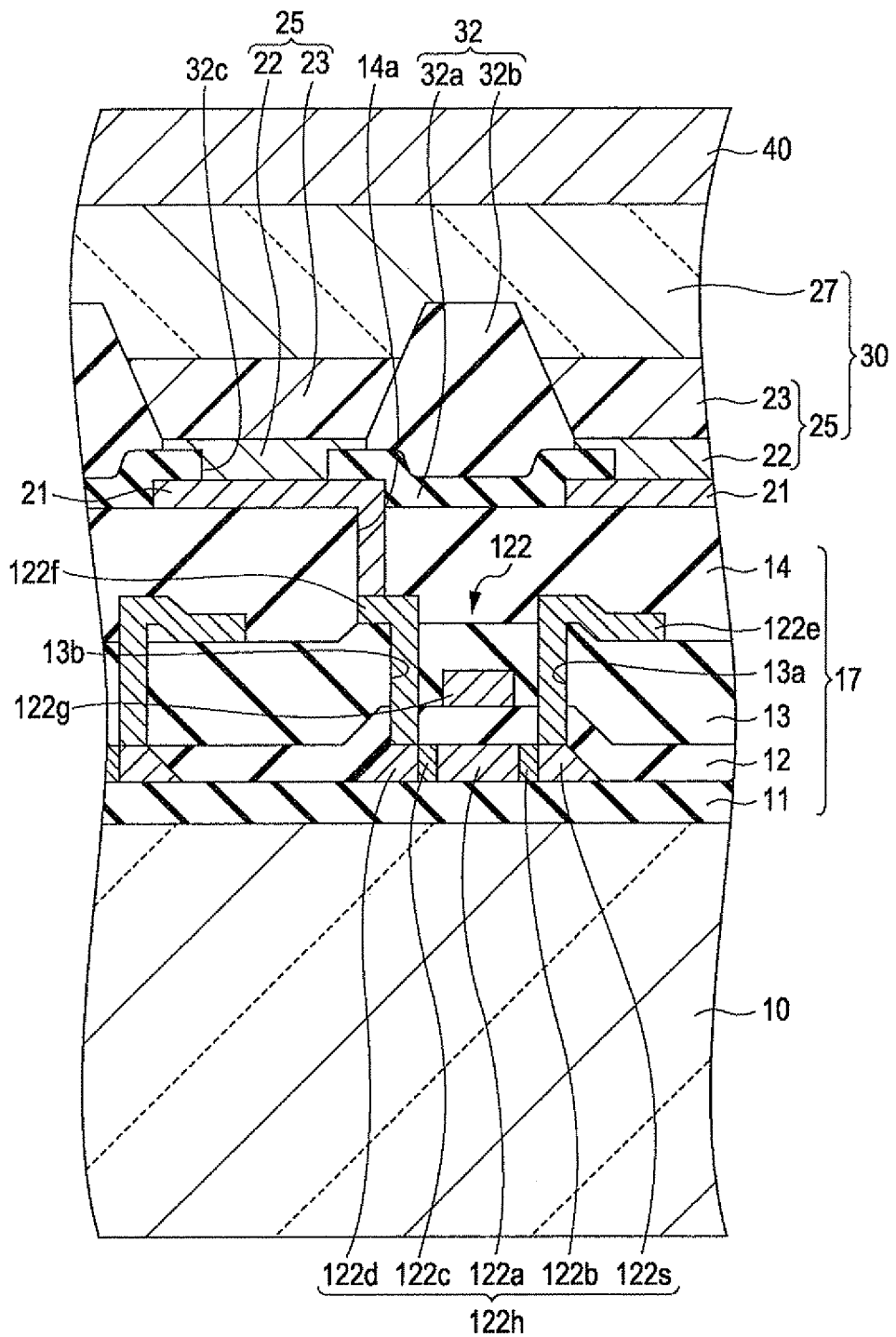
FIG. 4 is an enlarged cross-sectional view of main parts of the electro-optical device.

FIG. 1 is an outline plan view of a configuration of the electro-optical device. FIG. 2 is an equivalent circuit diagram showing an electrical configuration of the electro-optical device. FIG. 3 is an outline cross-sectional view of a structure of the electro-optical device, taken along a line shown in FIG. 1. FIG. 4 is an enlarged cross-sectional view of main parts of the electro-optical device.

As shown in FIG. 1, an electro-optical device 100 according to the first embodiment is an active-matrix light emitting device in which sub-pixels SG are driven and controlled by thin film transistors that serve as switching elements. The sub-pixels SG have light emitting elements, respectively. The electro-optical device 100 has the sub-pixels SG and a pixel region 107 on an element substrate 10 that has the thin film transistors (TFTs) arranged thereon. The sub-pixels SG support red (R), green (G) and blue (B) light and are arranged in a matrix form in the pixel region 107.

The electro-optical device 100 is described below, while the arrangement of the sub-pixels SG in the pixel region 107 is used as a standard, a direction in which the sub-pixels SG are arranged in rows is defined as X direction, and a direction in which the sub-pixels SG are arranged in columns is defined as Y direction.

A pair of scanning line driving circuits 101 is arranged in regions that are arranged in X direction and located outside the pixel region 107. The scanning line driving circuits 101 extend in Y direction.

In addition, a pair of connecting sections 105 is arranged so that the connection sections 105 overlap the scanning line driving circuits 101 in a planar view, respectively. The connecting sections 105 extend in Y direction. The connecting sections 105 are conductive bodies that electrically connect a connecting line 106 arranged on the element substrate 10 to one of a pair of electrodes provided for a light emitting element of each of the sub-pixels SG. The connecting sections 105 are described later in detail.

An inspecting circuit 103 and a line 104 are arranged along one side of the pixel region 107 and located outside the pixel region 107. In other words, the inspecting circuit 103 and the line 104 are arranged in an upper region in FIG. 1, or arranged on the side pointed by an arrow indicating Y direction. The line 104 connects the pair of scanning line driving circuits 101 to each other. In addition, the electro-optical device 100 has a terminal section arranged in a region located on the opposite side of the aforementioned upper region in which the inspecting circuit 103 is arranged. The terminal section connects the electro-optical device 100 to an external driving circuit. The terminal section has a flexible relay substrate 110.

The relay substrate 110 is a so-called FPC and has a driver IC 102 mounted in a planar manner. The driver IC 102 includes a data line driving circuit. A plurality of input lines 112 and a plurality of output lines 111 are arranged on the relay substrate 110. Signals are transmitted from the external driving circuit to the driver IC 102 through the plurality of input lines 112. Control signals are output from the driver IC 102 to the plurality of output lines 111. The plurality of output lines 111 that extend from the terminal section of the element substrate 10 are connected to the connecting lines 106 and lines 108. The connecting lines 106 are connected to the connecting sections 105. Some of the lines 108 are connected to the scanning line driving circuits 101, and the other lines 108 are connected to the light emitting elements of the sub-pixels SG.

In the present embodiment, among the peripheral circuits that drive and control the light emitting elements provided in the sub-pixels SG, the scanning line driving circuits 101 and the inspecting circuit 103 are arranged on the element substrate 10. However, the data line driving circuit that is included in the driver IC 102 may be arranged on the element substrate 10.

As shown in FIG. 2, the electro-optical device 100 has a plurality of scanning lines 101a, a plurality of data lines 102a and a plurality of power supply lines 102b. The plurality of data lines 102a cross (extend in a direction perpendicular to) the plurality of scanning lines 101a while the plurality of data lines 102a are insulated against the plurality of scanning lines 101a.

The plurality of scanning lines 101a are connected to the scanning line driving circuits 101 that each have a shift register and a level shifter. The plurality of data lines 102a are connected to the data line driving circuit of the driver IC 102. The data line driving circuit has a shifter register, a level shifter, a video line and an analog switch.

The sub-pixels SG are arranged in regions that are partitioned by the plurality of scanning lines 101a, the plurality of data lines 102a and the plurality of power supply lines 102b and arranged in a matrix form.

The sub-pixels SG each include: a switching TFT 121 that has a gate electrode to which a scanning signal is supplied through the scanning line 101*a*; a storage capacitor 123 that stores a pixel signal supplied from the data line 102*a* through the switching TFT 121; and a driving TFT 122 that has a gate electrode to which the pixel signal stored in the storage capacitor 123 is supplied. The sub-pixels SG each further include: a pixel electrode (anode) 21 that is one of the pair of electrodes and into which a driving current flows from the power supply line 102*b* when the pixel electrode 21 is electrically connected to the power supply line 102*b* through the driving TFT 122; a cathode 27 that is the other of the pair of electrodes; and a functional layer 25 that is arranged between the pixel electrode 21 and the cathode 27 and includes a light emitting layer. The pixel electrode 32, the functional layer 25 and the cathode 27, form a light emitting element (organic EL element) 30.

In FIG. 2, an illustration of the inspecting circuit 103 is omitted. The inspecting circuit 103 is a circuit for inspecting the state of an operation of the electro-optical device 100 and has an inspection information output unit that outputs the inspection result to an external device, for example. The inspecting circuit 103 is capable of inspecting a display quality and a defect during a process of manufacturing the electro-optical device and before the electro-optical device is shipped.

The driver IC 102 that controls an operation of the electro-optical device 100 applies a driving control signal and a driving voltage to the scanning line driving circuits 101 and the inspecting circuit 103. The driving control signal is a command signal related to control to be performed when the scanning driving circuits 101 and the inspecting circuits 103 each output a signal.

In the electro-optical device 100, when the scanning line 101*a* is driven so that the switching TFT 121 is turned on, a potential (pixel signal) of the data line 102*a* when the TFT 121 is turned on is stored in the storage capacitor 123. The state of the driving TFT 122, namely, the On or Off state of the driving TFT 122, is determined on the basis of the state of the storage capacitor 123. A current flows from the power supply line 102*b* through a channel of the driving TFT 122 to the pixel electrode 21. Then, the current flows through the functional layer 25 to the cathode 27. The functional layer 25 emits light on the basis of the amount of the current flowing in the functional layer 25 so that displaying is performed on the basis of the pixel signal.

As shown in FIG. 3, a circuit section 17 is arranged on the element substrate 10 and includes the driving TFTs 122 and lines such as the power supply lines 102*b*. Light emitting elements 30R, 30G and 30R are arranged on the circuit section 17 and correspond to red (R), green (G) and blue (B) light. A gas barrier layer 40 is arranged and covers the light emitting elements 30R, 30G and 30B.

The light emitting elements 30R, 30G and 30B are partitioned by partition wall portions 32 and arranged on the circuit section 17. Among the partition wall portions 32, partition wall portions that are located at an outer circumferential portion of the pixel region 107 are indicated by reference numeral 31. The plurality of light emitting elements 30 (light emitting elements 30R, 30G and 30B) are arranged in the pixel region 107. In addition, a region that extends between an outer edge of the pixel region 107 and an edge portion of the element substrate 10 is defined as a frame region 109.

The peripheral circuits (such as the scanning line driving circuits 101), the connecting lines 106 and the connecting sections 105 are arranged in the frame region 109.

The light emitting elements 30R, 30G and 303 each include the pixel electrode 21 and the functional layer 25 formed on the pixel electrode 21. The cathode 27 covers the functional layer 25 and the partition wall portions 32 and is one of the pair of electrodes between which the functional layer 25 is arranged.

The connecting lines 106 are electrically connected to the circuit section 107 so that a current flows in a depth direction. The connecting lines 106 are exposed to the surface of the circuit section 107. The connecting sections 105 overlap the exposed connecting lines 106. In addition, the connecting sections 105 are arranged on the circuit section 17 and extend from the side of the connecting lines 106 to wall surfaces of the partition wall portions 31 through regions in which the scanning line driving circuits 101 are arranged. Specifically, the connecting sections 105 are connected to the connecting lines 106, overlap the scanning line driving circuits 101 in the planar view, and extend toward the pixel region 107. Portions that are included in the connecting sections 105 and located on the wall surfaces of the partition wall portions 31 are called first edge portions 105*a* of the connection sections 105, while portions that are included in the connecting sections 105 and overlap the connecting lines 106 are called second edge portions 105*b* of the connection sections 105.

The connecting lines 106 extend along the scanning line driving circuits 101 in Y direction in the planar view as shown in FIG. 1. The connecting lines 106 are continuously connected to the connecting sections 105 in the planar view in the direction (Y direction) in which the connecting lines 106 extend. However, the connecting lines 106 and the connecting sections 105 are not limited to this structure. The connecting lines 106 and the connecting sections 105 may be configured so that the connecting lines 106 are partially connected to the connecting sections 105 through contact holes in the direction in which the connecting lines 106 extend. In this case, the connecting lines 106 can be electrically connected to the connecting sections 105 in consideration of the planar arrangement of the peripheral circuits such as the scanning line driving circuits 101, lines connected to the peripheral circuits and the like.

The cathode 27 covers the functional layer 25 and the partition wall portions 32 in the pixel region 107. In addition, the cathode 27 covers the first edge portions 105*a* in the frame region 109, while the first edge portions 105*a* are arranged on the wall surfaces of the partition wall portions 31. Thus, the connecting lines 106 are electrically connected to the cathode 27 through the connecting sections 105. Even when the widths of the partition wall portions 31 are smaller than the widths of the other partition wall portions 32 in the planar view, the contact areas of the wall surfaces with the first edge portions 105*a* are ensured so that stable resistance to conduction is achieved. This is due to the fact that the first edge portions 105 that are arranged on the wall surfaces overlap the cathode 27.

The gas barrier layer 40 covers the cathode 27 in the pixel region 107 and covers the second edge portions 105*b* of the connecting sections 105 in the frame region 109. This structure prevents oxygen and moisture from flowing into the pixel region 107 from an interface between the circuit section 17 (connecting lines 106) and the cathode 27 and interfaces between the circuit section 17 (connecting lines 106) and the connecting sections 105.

The light emitting elements 30 (light emitting elements 30R, 30G and 30B) according to the present embodiment each have a top emission structure, although the structure is described later in detail. Light emitted by the functional layer 25 is extracted on the side of the cathode 27. Thus, it is necessary that the cathode 27 be made of a translucent material. A transparent conductive material is used as the material of the cathode 27. As the transparent conductive material, an indium tin oxide (ITO) is suitable. However, an amorphous indium zinc oxide transparent conductive film (Indium Zinc Oxide: IZO (registered trademark)) (made by Idemitsu Kosan Co., Ltd.) can be used as the transparent conductive material. In the present embodiment, ITO is used as the material of the cathode 27.

Since the connecting sections 105 that connect the cathode 27 to the connecting lines 106 are arranged in the frame region 109, the connecting sections 105 do not need to be translucent. A metal material such as Al or an alloy containing Al can be used as a material of the connecting sections 105 and has lower specific resistance than the cathode 27.

It is preferable that the connecting lines 106 be simultaneously formed in a process of forming the thin film transistors and the lines. The thin film transistors and the lines form the circuit section 17. Next, the light emitting elements 30 and the circuit section 17, which are related to the configurations of the connecting lines 106, are described.

As shown in FIG. 4, the circuit section 17 is arranged on the element substrate 10, while the light emitting elements 30 are arranged on the circuit section 17. The side of the circuit section 17 is first described.

A base insulating layer 11 that is made of an inorganic insulating material such as a silicon oxide is arranged on the element substrate 10 so as to cover the surface of the element substrate 10. The TFTs 122 are arranged on the base insulating layer 11. The TFTs 122 each include a semiconductor layer 122h, a gate insulating film 12 and a gate electrode 122g. The semiconductor layer 122h is formed in an island shape and made of polysilicon, for example. The gate insulating film 12 covers the semiconductor layer 122h and is made of an inorganic insulating material such as a silicon oxide or a silicon nitride. The gate electrode 122g is arranged on the gate insulating film 12.

The semiconductor layer 122h has a channel region 122a that overlaps the gate electrode 122g through the gate insulating film 12. The gate electrode 122g is a part of the scanning line 101a, although the part of the scanning line 101a is not shown in FIG. 4. A first interlayer insulating film 13 covers the gate insulating film 12 and includes a silicon oxide as a main material, for example. The gate insulating film 12 covers the semiconductor layer 122h, and the gate electrode 122g is formed on the gate insulating film 12.

In addition, the semiconductor layer 122h has a low-density source region 122b and a high-density source region 122s, which are located on the source side of the channel region 122a. The semiconductor layer 122h also has a low-density drain region 122c and a high-density drain region 122d, which are located on the drain side of the channel region 122a. Thus, the semiconductor layer 122h has a so-called light doped drain (LDD) structure. Among the regions, the high-density source region 122s is connected to a source electrode 122e through a contact hole 13a that is open and extends through the gate insulating film 12 and the first interlayer insulating film 13. The source electrode 122e is a part of the power supply line 102b (refer to FIG. 2) that extends in a direction perpendicular to the surface of the sheet of FIG. 4 and is located at the source electrode 122e in FIG. 4. The high-density drain region 122d is connected to a drain electrode 122f through a contact hole 13b that is open and extends through the gate insulating film 12 and the first interlayer insulating film 13. The drain electrode 122f is made of the same material as the source electrode 122e.

The source electrode 122e and the drain electrode 122f are formed on an upper layer of the first interlayer insulating film 13, while the upper layer of the first interlayer insulating film 13 is covered with a second interlayer insulating film 14. The second interlayer insulating film 14 includes an acrylic resin component as a main material, for example. A material other than an acrylic organic insulating material can be used as a material of the second interlayer insulating film 14. For example, an inorganic insulating material such as a silicon oxide or a silicon nitride can be used as the material of the second interlayer insulating film 14. The pixel electrode 21 made of ITO or the like is formed on the surface of the second interlayer insulating film 14 and connected to the drain electrode 122f through a contact hole 14a formed in the second interlayer insulating film 14. Thus, the pixel electrode 21 is connected to the high-density drain region 122d of the semiconductor layer 122h through the drain electrode 122f.

The source electrode 122e, the drain electrode 122f and the gate electrode 122g may be made of a low-resistance wiring material such as Al.

An N-channel type or P-channel type TFT that forms, for example, an inverter of the shift register included in each of the scanning line driving circuits 101 and the inspecting circuit 103 has the same structure as the driving TFTs 122 except that the TFT is not connected to the pixel electrode 21.

The light emitting elements 30 that are formed on the circuit section 17 each include the pixel electrode 21, the cathode 27 and the functional layer 25 located between the cathode 27 and the pixel electrode 21. In addition, the light emitting elements 30 are partitioned by the partition wall portions 32. Specifically, the partition wall portion 32 covers an outer edge portion of the pixel electrode 21 and includes a lower layer partition wall portion 32a and an upper layer partition wall portion 32b. The lower layer partition wall portion 32a has an opening 32c located on the pixel electrode 21. The upper layer partition wall portion 32b is located on the lower layer partition wall portion 32a and substantially partitions a film formation region in which the functional layer 25 is formed. The lower layer partition wall portion 32a is made of an inorganic insulating material such as a silicon oxide. The upper layer partition wall portion 32b is made of an organic insulating material such as an epoxy system or a polyimide system.

The functional layer 25 includes a hole injection transport layer 22 and a light emitting layer 23. The hole injection transport layer 22 is formed on the side of the pixel electrode 21. The light emitting layer 23 overlaps the hole injection transport layer 22. In the present embodiment, the functional layer 25 (including the hole injection transport layer 22 and the light emitting layer 23) is formed by coating a liquid material containing a material of the functional layer on the film formation region and drying the liquid material.

A polythiophene derivative, a polypyrrole derivative, a doping body containing at least one of the derivatives, or the like is used as a material of the hole injection transport layer 22. Specifically, a liquid containing dispersed poly(3,4-ethylenedioxy thiophene)/poly(styrenesulfonate) (PEDOT/PSS) (Product name: Bytron-p) (made by Bayer), or the like is used as the material of the hole injection transport layer 22. In other words, a liquid that is obtained by dispersing poly(3,4-ethylenedioxy thiophene) in poly(styrenesulfonate) (used as a dispersion medium) to form a compound and dispersing the formed compound in water is used as the material of the hole injection transport layer 22, for example.

As a material of the light emitting layer 23, a known light emitting material capable of emitting fluorescence or phosphorescence can be used. Specifically, a poly(fluorene) (PF)

derivative, a polyparaphenylene vinylene (PPV) derivative, a polyphenylene (PP) derivative, a polyparaphenylene (PPP) derivative, polyvinyl carbazole (PVK), a polythiophene derivative, a polysilane system such as poly(methyl phenyl silane) (PMPS) or the like is preferably used as the material of the light emitting layer 23.

In addition, a material that is obtained by doping a high-molecular material (such as a perylene-based pigment, coumarin-based pigment, or a rhodamine-based pigment) in any of the aforementioned high-molecular materials can be used as the material of the light emitting layer 23. Furthermore, a material that is obtained by doping a low-molecular material (such as rubrene, perylene, 9,10-diphenylanthracene, tetraphenylbutadiene, nile red, coumarin 6, or quinacridone) in any of the aforementioned high-molecular materials can be used as the material of the light emitting layer 23.

Instead of the aforementioned high-molecular materials, a conventional known low-molecular material can be used.

The configuration of the functional layer 25 is not limited to this. The functional layer 25 mainly includes the light emitting layer 23 and may further include carrier injection layers (such as a hole injection layer and an electron injection layer) or carrier transport layers (such as a hole transport layer and an electron transport layer). In addition, the functional layer 25 may include a hole blocking layer and an electron blocking layer.

Since the light emitting elements 30 each have the top emission structure as described above, the cathode 27 that covers the functional layer 25 is made of a transparent conductive film material such as ITO.

The gas barrier layer 40 that covers the cathode 27 is made of an inorganic compound, for example. The gas barrier layer 40 is preferably made of a silicon compound such as a silicon nitride, a silicon oxynitride or a silicon oxide. However, the gas barrier layer 40 may be made of alumina, a tantalum oxide, a titanium oxide, another ceramic or the like. When the gas barrier layer 40 is made of an inorganic compound, the gas barrier layer 40 has high adhesion to the cathode 27 (made of an inorganic transparent conductive material such as ITO) and a high barrier property against oxygen and moisture and is a precise, defect-free layer.

The gas barrier layer 40 may have a structure with layers that are stacked and made of different materials among the aforementioned silicon compounds. For example, it is preferable that the gas barrier layer 40 be formed by stacking a silicon nitride and a silicon oxynitride in this order from the side of the cathode 27 or stacking a silicon oxynitride and a silicon oxide in this order from the side of the cathode 27. With the exception of these combinations, when two or more layers made of silicon oxynitrides having different proportions are stacked to form the gas barrier layer 40, it is preferable that the gas barrier layer 40 be formed so that the density of oxygen contained in a certain layer located on the side of the cathode 27 is lower than the density of oxygen contained in another layer located on the outer side of the certain layer.

Since the density of oxygen contained in the certain layer located on the side of the cathode 27 is lower than the density of oxygen contained in the layer located on the outer side of the certain layer, this structure prevents oxygen contained in the gas barrier layer 40 from reaching the light emitting layer 23 located on the inner side of the cathode 27 through the cathode 27 and deteriorating the light emitting layer 23. It is, therefore, possible to increase the lifetime of the light emitting layer 23.

The gas barrier layer 40 may not have a structure with layers stacked. The gas barrier layer 40 may be configured so that the proportions of components that form the gas barrier layer 40 vary depending on the part of the gas barrier layer 40. Especially, the gas barrier layer 40 may be configured so that the density of oxygen continuously or discontinuously varies. In this case, it is preferable that the gas barrier layer 40 be configured so that the density of oxygen existing on the side of the cathode 27 is lower than the density of oxygen existing on the outer side for the aforementioned reasons.

In addition, it is preferable that the thickness of the gas barrier layer 40 be in a range of 10 nm to 500 nm. When the thickness of the gas barrier layer 40 is smaller than 10 nm, a through hole may be partially formed due to a defect of the film or a variation of the thickness of the film and the gas barrier property may be deteriorated. When the thickness of the gas barrier layer 40 is larger than 500 nm, a crack may be formed due to stress.

Since the light emitting elements 30 each have the top emission structure in the present embodiment, it is necessary that the gas barrier layer 40 be translucent. In the present embodiment, therefore, light transmittance of visible light is set to, for example, 80% or higher by adjusting the material and width of the gas barrier layer 40.

Method for Manufacturing Electro-Optical Device

Figure 5:
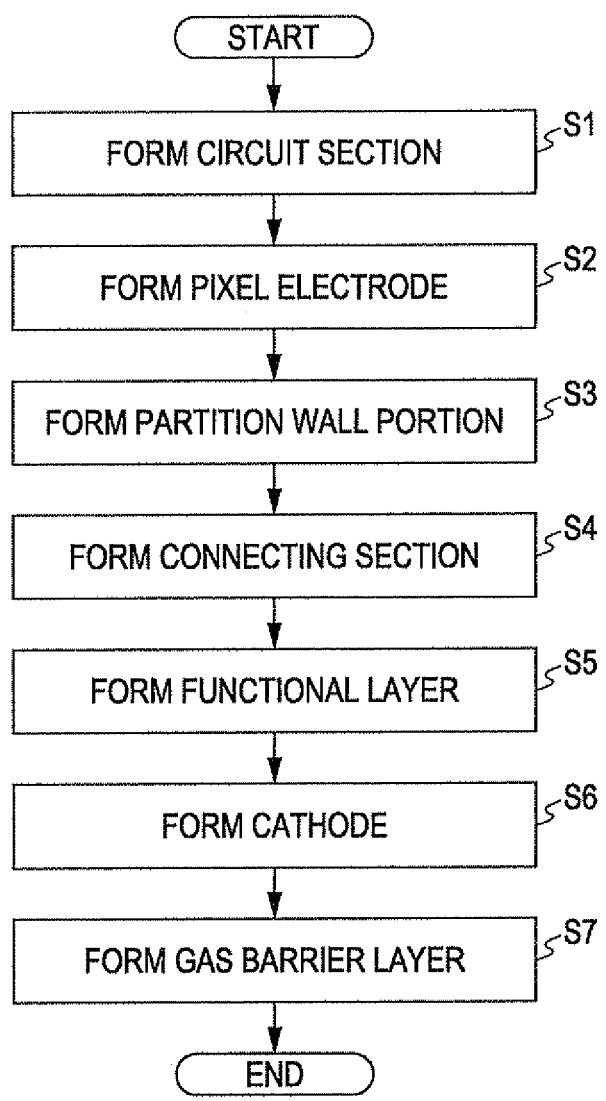
FIG. 5 is a flowchart of a method for manufacturing the electro-optical device.

Next, a method for manufacturing the electro-optical device 100 according to the present embodiment is described with reference to FIGS. 5 to 8. FIG. 5 is a flowchart of the method for manufacturing the electro-optical device. FIGS. 6A to 6D and 7A to 7D are outline cross-sectional views of the electro-optical device and show the method for manufacturing the electro-optical device. FIG. 8 is an outline cross-sectional view of an example of the electro-optical device when the electro-optical device has a protective layer. In FIGS. 6A to 7D, a main configuration of the circuit section 17 is clearly shown, and an illustration of a detailed structure (configuration) is omitted.

As shown in FIG. 5, the method for manufacturing the electro-optical device includes a process (step S1) of forming the circuit section, a process (step S2) of forming the pixel electrode, a process (step S3) of forming the partition wall portion, a process (step S4) of forming the connecting section, a process (step S5) of forming the functional layer, a process (step S6) of forming the cathode and a process (step S7) of forming the gas barrier layer.

Figure 6A:
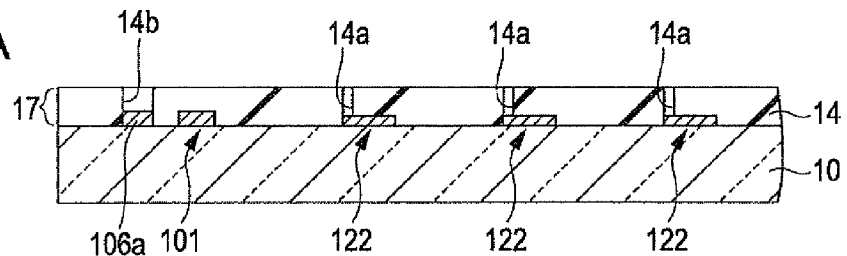
FIGS. 6A to 6D are outline cross-sectional views of the electro-optical device and show the method for manufacturing the electro-optical device.

As shown in FIG. 6A, in the process of forming the circuit section in step S1, the circuit section 17 is formed on the element substrate 10. The configuration of the circuit section 17 is described above, and the circuit section 17 can be formed using a known method. For example, the semiconductor layer 122h (refer to FIG. 4) of the driving TFT 122 may be formed as follows. First, an amorphous silicon layer is formed on the base insulating layer 11 using an ICVD method or a plasma CVD method. After that, crystal grains are grown by a laser annealing method or a rapid heating method so that a polysilicon layer is formed. Then, the polysilicon is patterned and formed in an island shape. An impurity such as boron is injected in the polysilicon layer so that the regions of the semiconductor layer 122h are formed and have different impurity densities. In the process of forming the circuit section, the scanning line driving circuit 101 and a wiring section 106a are simultaneously formed. In this case, the wiring section 106a is formed in the connecting line 106 that is formed later.

The wiring section 106a may be formed by patterning the polysilicon layer and injecting an impurity in the polysilicon layer so as to cause the polysilicon layer to have a conductive property. In a process of forming a gate electrode, a source electrode and a drain electrode, a conductive layer may be formed so that the conductive layer overlaps the wiring section 106a.

In addition, the second interlayer insulating film 14 that forms the outermost surface of the circuit section 17 may be formed by coating an acrylic high-molecular organic insulating material using a spin coating method and drying the acrylic high-molecular organic insulating material. The contact hole 14a and the contact hole 14b are formed by etching the second interlayer insulating film 14. The contact hole 14a connects the pixel electrode 21 to the TFT 122, while the contact hole 14b is formed on the wiring section 106a. The pixel electrode 21 is formed later. The contact holes 14a and 14b may be formed as follows. A photosensitive resin material is used as the second interlayer insulating film 14 and coated, and the coated photosensitive resin film is exposed and developed so that the contact holes 14a and 14b are formed. Then, the process proceeds to step S2.

Figure 6B:
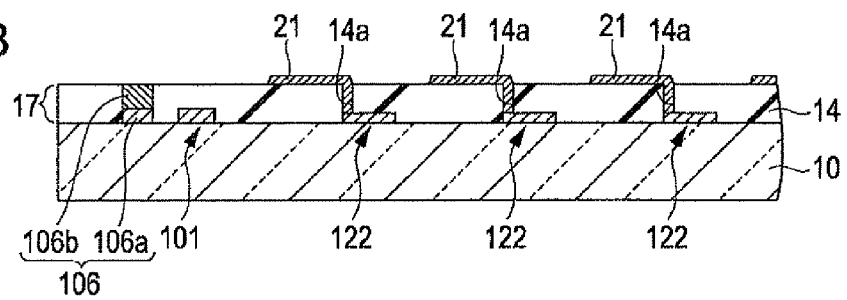

As shown in FIG. 6B, in the process of forming the pixel electrode in step S2, the contact hole 14a is filled with the pixel electrode 21, and the contact hole 14b is filled with a wiring section 106b. Specifically, an ITO film is formed so as to cover the second interlayer insulating film 14 and patterned so that the pixel electrode 21 and the wiring section 106b are formed. The wiring section 106b is formed on the wiring section 106a so that the wiring sections 106a and 106b form the connecting line 106. Then, the process proceeds to step S3.

Figure 6C:
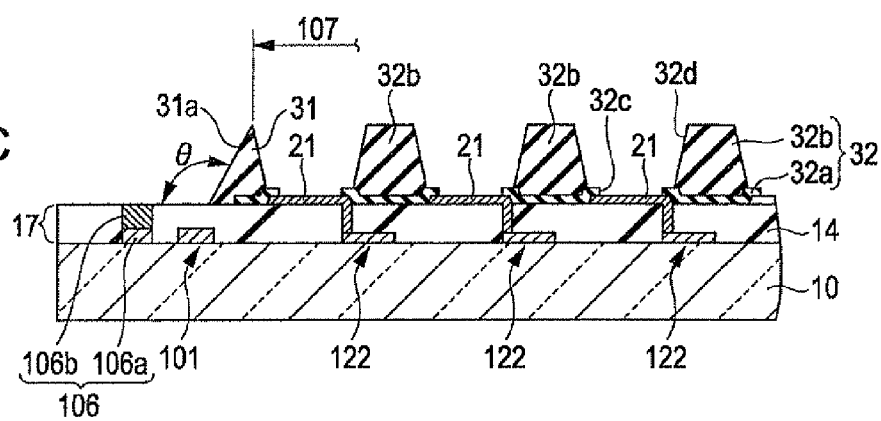

As shown in FIG. 6C, in the process of forming the partition wall portion in step S3, the lower layer partition wall portion 32a is first formed and covers the outer edge portion of the pixel electrode 21. The lower layer partition wall portion 32a may be formed by forming an inorganic insulating film made of a silicon oxide or the like by a low-pressure CVD method or the like while masking a part corresponding to the opening 32c on the pixel electrode 21. The thickness of the film is approximately in a range of 100 nm to 200 nm. Subsequently, a material that is obtained by dissolving a resist such as acrylic resin or polyimide resin in a solvent is coated by a coating method such as a spin coating method or a dip coating method so that the coated material forms an organic layer and covers the pixel electrode 21 and the lower layer partition wall portion 32a, for example. A constituent material of the organic layer may be any material as long as the material is not be dissolved in a solvent of a liquid material to be used in the process (to be performed later) of forming the functional layer, has an insulation property, and is easily patterned.

Subsequently, the organic layer is patterned using a photolithographic technique and an etching technique so that an opening 32d is formed in the organic layer, and the upper layer partition wall portion 32b that has the wall surface on the side of the opening 32d is formed on the lower layer partition wall portion 32a. In this process, the partition wall portion 31 is simultaneously formed and is located at the outer circumferential portion of the pixel region 107. It is preferable that the partition wall portion 31 that has a wall surface 31a be formed so that the wall surface 31a located on the outer side of the pixel region 107 is gently inclined with respect to the surface of the circuit section 17. In this case, it is possible to ensure various conductive films to be formed on the wall surface 31a and a coverage property of the gas barrier layer 40 that covers the conductive films. In the present embodiment, the wall surface 31a is inclined at an angle of approximately 110 degrees with respect to the surface of the circuit section 17. The heights of the partition wall portions 31 and 32 located on the circuit section 17 are approximately in a range of 1 µm to 2 µm. Then, the process proceeds to step S4.

Figure 6D:
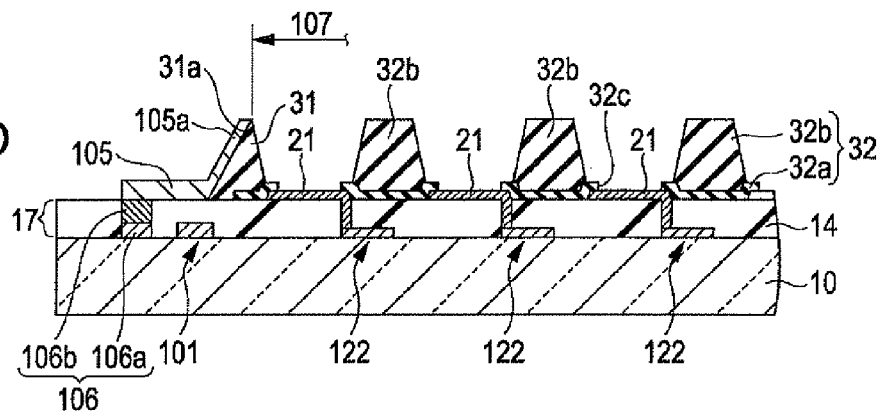

As shown in FIG. 6D, in the process of forming the connecting section in step S4, a low-resistance wiring material such as Al is used so as to form a conductive film while the pixel region 107 is masked. Then, the conductive film is patterned using a photolithographic method so that the first edge portion 105a located on the side of the pixel region 107 covers the wall surface 31a of the partition wall portion 31 and the second edge portion 105b overlaps the connecting line 106. The first edge portion 105a and the second edge portion 105b form the connecting section 105. As shown in FIG. 1, the pair of connecting sections 105 is formed in a substantially rectangular shape in the planar view so that the connecting sections 105 are located on the outer side of the pixel region 107 and cover the regions in which the scanning line driving circuits 101 are arranged. The thicknesses of the connecting sections 105 are approximately in a range of 100 nm to 200 nm. Then, the process proceeds to step S5.

In the process of forming the functional layer in step S5, the film formation region that is partitioned by the partition wall portions 32 is first subjected to a surface treatment. Specifically, a plasma treatment is performed using oxygen as treating gas so that the following surfaces have a lyophilic property: the surface (including the wall surface of the upper layer partition wall portion 32b) of the upper layer partition wall portion 32b; the surface of the pixel electrode 21; and the surface (covering the outer edge portion of the pixel electrode 21 and located in the film formation region) of the lower layer partition wall portion 32a. Subsequently, a plasma treatment is performed using tetrafluoromethane ($CF_4$) as treating gas in an atmosphere so that the surface (including the wall surface of the upper layer partition wall portion 32b) of the upper layer partition wall portion 32b made of an organic insulating material has a liquid-repellent property.

The surface of the pixel electrode 21 with the lyophilic property and a part of the lower layer partition wall portion 32a are slightly affected by the plasma treatment using $CF_4$. However, since ITO (that is an inorganic material forming the pixel electrode 21), a silicon oxide (that is an inorganic material forming the lower layer partition wall portion 32a) and the like have a low affinity for fluorine, the lyophilic properties are ensured.

Figure 7A:
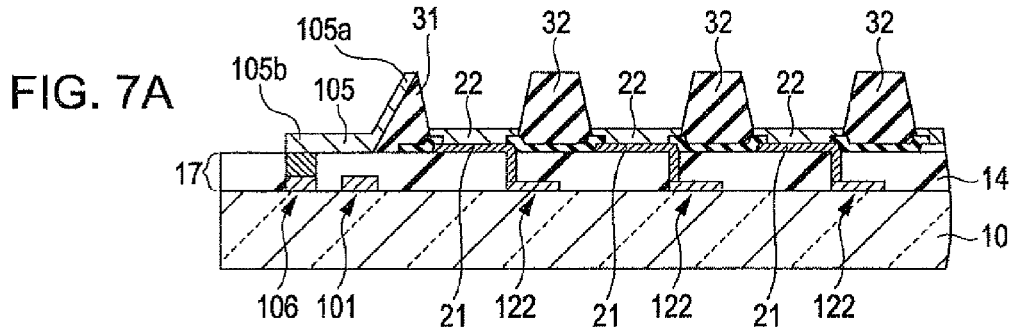
FIGS. 7A to 7D are outline cross-sectional views of the electro-optical device and show the method for manufacturing the electro-optical device.
Figure 8:
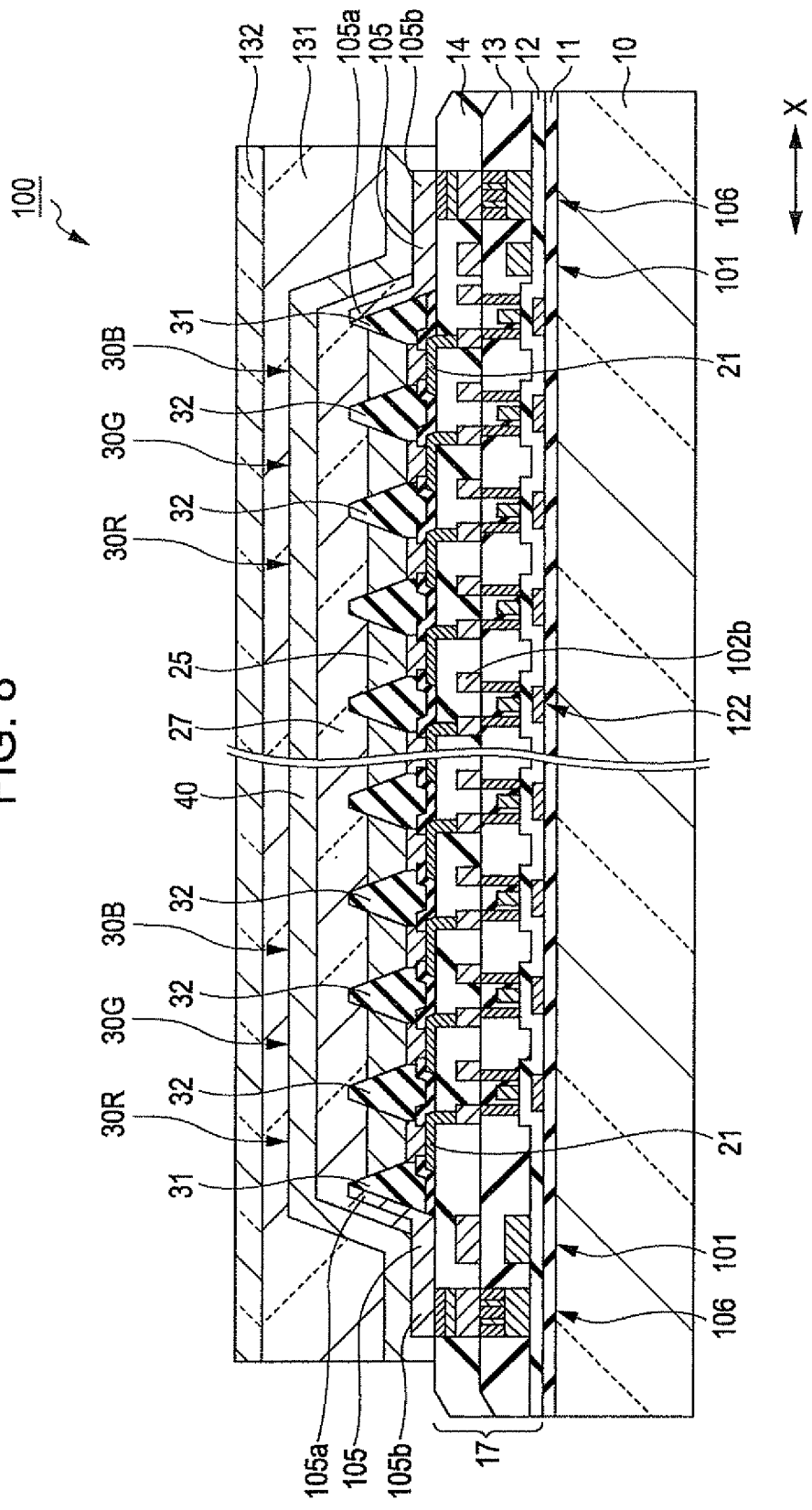
FIG. 8 is an outline cross-sectional view of an example of the electro-optical device when the electro-optical device has a protective layer.

Next, a liquid material containing the material of the hole injection transport layer is coated on the film formation region partitioned by the partition wall portions 32 and is dried so as to form the hole injection transport layer 22 as shown in FIG. 7A. The liquid material may be coated by a droplet discharging method or a spin coating method. In the droplet discharging method, a nozzle of a discharge head discharges the liquid material as a droplet, for example. Since a predetermined amount of the liquid material can be selectively coated on the film formation region without waste in the droplet discharging method, it is preferable that the droplet discharging method be used.

A droplet that is discharged from the nozzle is wet and spreads on the surface of the pixel electrode 21 that has the lyophilic property so that the film formation region is filled with the droplet. On the other hand, another droplet that is discharged from the nozzle and drops on the surface of the upper layer partition wall portion 32b with the liquid-repellent property is bounced and disposed in the film formation region. The liquid material with which the film formation region is filled is dried so that the hole injection transport layer 22 is formed and has a thickness of approximately 50 nm to 100 nm.

After the hole injection transport layer 22 is formed, it is preferable that a film be formed using inert gas such as nitrogen or argon so as to prevent the hole injection transport layer 22 and the light emitting layer 23 (to be formed after the formation of the layer 22) from being oxidized.

Figure 7B:
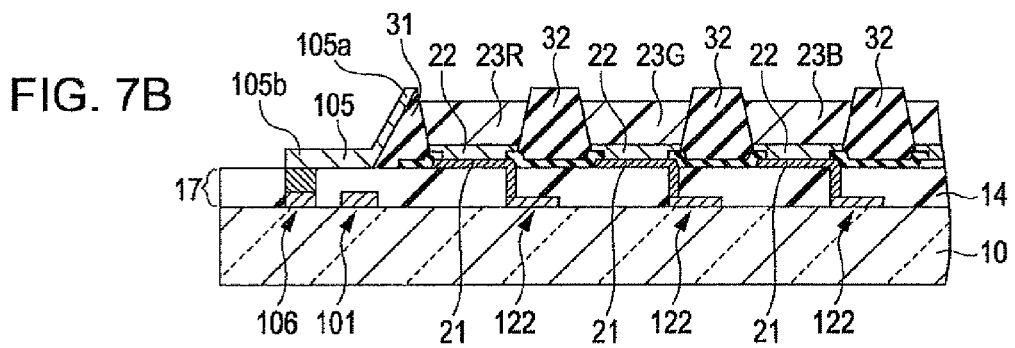

Subsequently, a liquid material containing the material of the light emitting layer is coated on the film formation region partitioned by the partition wall portions 32 and is dried so as to form the light emitting layer 23 as shown in FIG. 7B. A nonpolar solvent that is insoluble in the hole injection transport layer 22 is used as a solvent of the liquid material in order to prevent the hole injection transport layer 22 from being redissolved due to the coating of the liquid material.

The light emitting layer 23 is formed by coating the liquid material containing the material (of the light emitting layer) that allows red, green and blue light to be emitted. Specifically, a red light emitting layer 23R is formed by coating a liquid material containing a material of the red light emitting layer on a predetermined part of the film formation region. A green light emitting layer 23G for emitting green light and a blue light emitting layer 23B for emitting blue light are formed in the same manner as the red light emitting layer 23R. The thicknesses of the light emitting layers 23R, 23G and 23B formed by filling the liquid materials in the film formation region and drying the liquid materials are approximately in a range of 100 nm to 300 nm.

In the present embodiment, the functional layer 25 is formed by coating the liquid material containing the material of the functional layer 25 on the film formation region. However, the method for forming the functional layer 25 is not limited to this. For example, the hole injection transport layer 22 is formed using the droplet discharging method, and the light emitting layer 23 may be formed using a mask deposition method. In addition, among the light emitting layers 23R, 23G and 23B that emit light of different colors, only the light emitting layer 23B may be formed using the mask deposition method, for example. Then, the process proceeds to step S6.

Figure 7C:
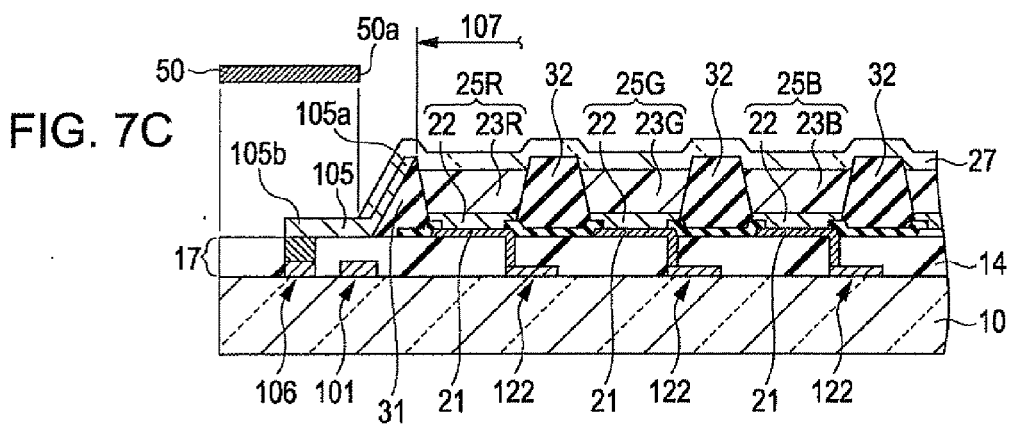

As shown in FIG. 7C, in the process of forming the cathode 27 in step S6, the cathode 27 is formed by a mask deposition method using a mask 50 that has an opening 50a that is slightly larger than the size of the pixel region 107 in the planar view. In this case, ITO is used as a material of the cathode 27 so as to form the film in the mask deposition method. The cathode 27 is formed and covers the light emitting layer 23 and the partition wall portion 32. The accuracy of the position and outer shape of the cathode 27 formed using the mask deposition method is lower than the accuracy of the position and outer shape of a cathode formed by patterning using a photolithographic method. The cathode 27 is formed and covers the first edge portion 105a of the connecting section formed on the wall surface 31a of the partition wall portion 31 in the region located outside the pixel region 107. The second edge portion 105b of the connecting section 105 is already electrically connected to the connecting line 106. Thus, when the cathode 27 is formed and covers the first edge portion 105a of the connecting section 105, the cathode 27 can be electrically connected to the connecting line 106 through the connecting section 105. The thickness of the cathode 27 in the pixel region 107 is approximately in a range of 100 nm to 200 nm. Then, the process proceeds to step S7.

Figure 7D:
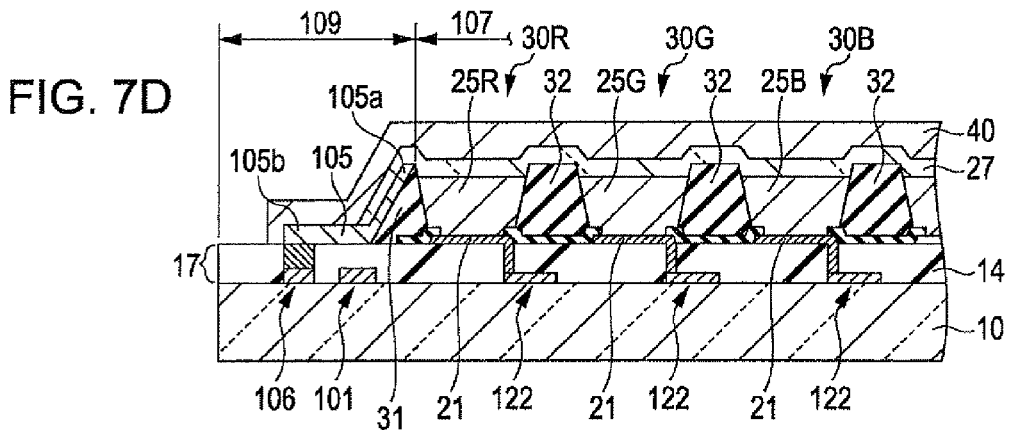

As shown in FIG. 7D, in the process of forming the gas barrier layer in step S7, the gas barrier layer 40 is formed so as to cover the cathode 27 in the pixel region 107 and cover the second edge portion 105b of the connecting section 105 in the frame region 109 located outside the pixel region 107. It is preferable that the gas barrier layer 40 be formed using a physical vapor deposition method such as a sputtering method or an ion plating method or a chemical vapor deposition method such as a plasma CVD method. In the physical vapor deposition method such as the sputtering method or the ion plating method, a film that has a relatively high adhesion property can be formed even on a heterogeneous substrate surface in general. However, the formed film contains a grain aggregate and a defect easily occurs in the film. In addition, large stress easily occurs in the film. On the other hand, in the chemical vapor deposition method, a precise, excellent film that has small stress, a high step coverage property and almost no defect can be formed. However, the film has low adhesion to and low film formability on a heterogeneous substrate surface in general. Thus, the gas barrier layer 40 that entirely has a high gas barrier property (against oxygen and moisture) in the entire gas barrier layer 40 can be formed using the following method for a relatively short time. First, a part of the film (gas barrier layer) is initially formed using the physical vapor deposition method so that the thickness of the part of the film is a half or more of the thickness of the entire film. Then, the other part of the film is formed using the chemical vapor deposition method so that the other part of the film compensates for a defect of the initially formed part of the film.

The gas barrier layer 40 may be made of a single material and constituted by a single layer as described above. In addition, the gas barrier layer 40 may be made of different materials and constituted by a plurality of stacked layers. Furthermore, the gas barrier layer 40 may be constituted by a single layer so that the proportions of components of the gas barrier layer 40 continuously or discontinuously vary in the direction in which the thickness of the film (gas barrier layer 40) is measured.

When the gas barrier layer 40 is made of different materials and has a plurality of stacked layers, it is preferable that an inner layer (located on the side of the cathode 27) be formed by the physical vapor deposition method as described above and made of a silicon nitride, a silicon oxynitride or the like, and an outer layer be formed by the chemical vapor deposition method and made of a silicon oxynitride, a silicon oxide or the like.

In addition, the gas barrier layer 40 may be formed as follows. First, in order to form the inner layer using the physical vapor deposition method, the amount of oxygen to be supplied into a film forming device is set to a small value. Then, the amount of oxygen is continuously or discontinuously increased. As a result, the gas barrier layer 40 is formed so that the density of oxygen contained in an inner part (located on the side of the cathode 27) of the gas barrier layer 40 is low and the density of oxygen contained in an outer part of the gas barrier layer 40 is high.

The gas barrier layer 40 may be formed using a single film forming method. In this case, it is preferable that the density of oxygen contained in the inner part (located on the side of the cathode 27) of the gas barrier layer 40 be low. In this case, the total thickness of the gas barrier layer 40 is approximately 400 nm.

According to the method for manufacturing the electrooptical device 100, even when the cathode 27 is formed using the mask deposition method so that the accuracy of the position and outer shape of the cathode 27 is lower than the accuracy of the position and outer shape of a cathode formed by patterning using a photolithographic method, the cathode 27 overlaps the first edge portion 105a of the connecting section 105 in the frame region 109. As a result, the connecting line 106 and the cathode 27, which are arranged in the circuit section 17, can be stably connected to each other through the connecting section 105.

If the cathode 27 were to be formed using the mask deposition method so that the connecting line 106 and the cathode 27 are formed in the circuit section 17 and directly connected to each other, it would be necessary that the contact area of the cathode 27 with the connecting line 106 be large in consideration of a variation in the accuracy of the position and shape of the cathode 27 formed using the mask deposition method. In other words, in consideration of the aforementioned contact area, it would be necessary to ensure the frame region 109 in which the connecting line 106 is formed. On the other hand, in the present embodiment, the connecting section 105 that connects the connecting line 106 to the cathode 27 is formed using a photolithographic method so that the accuracy of the position of the connecting section 105 is high and the cathode 27 is formed using the mask deposition method so as to cover the first edge portion 105a located on the side of the pixel region 107. Therefore, the width of the frame region 109 can be substantially reduced.

In addition, the first edge portion 105a of the connecting section 105 is formed along the wall surface 31a of the partition wall portion 31 located at the outer circumference of the pixel region 107. Thus, even when the frame region 109 is narrowed, it is possible to ensure a three-dimensional region for the contact area of the first edge portion 105a with the cathode 27 and stably connect the first edge portion 105a to the cathode 27.

The present embodiment describes that the electro-optical device 100 has the top emission structure. However, the electro-optical device 100 is not limited to this structure. The electro-optical device 100 may have a bottom emission structure that causes light emitted by the functional layer 25 to be output from the side of the element substrate 10. When the electro-optical device 100 has the bottom emission structure, it is not necessary that the cathode 27 be transparent, but it is necessary that the element substrate 10 be translucent.

In order to efficiently output the light from the side of the element substrate 10, it is preferable that the switching TFTs 121, the driving TFTs 122, the lines connected to the switching TFTs 121, and the lines connected to the driving TFTs 122, be not formed directly under the light emitting elements 30 and be formed directly under the partition wall portions 32 so that an aperture is increased.

The electro-optical device 100 may be used while the light emitting elements 30 are covered with the gas barrier layer 40. However, when the electro-optical device 100 has the top emission structure and a human body repeatedly contacts the electro-optical device 100 on the side of the gas barrier layer 40 from which emitted light can be output, the light emitting elements 30 may be damaged. To avoid this, it is preferable that a transparent protective layer 132 be formed and cover at least the gas barrier layer 40 through a transparent buffer layer 131 as shown in FIG. 8.

The buffer layer 131 adheres to the gas barrier layer 40 and has a buffering function of absorbing mechanical shock applied from the outside. In addition, the buffer layer 131 is made of urethane resin, acrylic resin, epoxy resin, polyolefin resin or the like and more flexible than the protective layer 132 (described later). The buffer layer 131 is formed using an adhesive agent made of a material with a low glass-transition point. It is preferable that the adhesive agent have a silane coupling agent or alkoxysilane added thereto. When the adhesive agent has the silane coupling agent or alkoxysilane added thereto, the adhesiveness of the formed buffer layer 131 to the formed gas barrier layer 40 is excellent, and the buffering function of absorbing mechanical shock is improved. When the gas barrier layer 40 is made of a silicon compound, the adhesiveness of the formed buffer layer 131 to the formed gas barrier layer 40 can be improved by the silane coupling agent or alkoxysilane, and the gas barrier property can be improved.

Since the protective layer 132 is formed on the buffer layer 131, the protective layer 132 has at least one of the following properties: pressure resistance; abrasion resistance; a property of preventing reflection of external light; a gas barrier property; an ultraviolet shielding property; and the like. Specifically, the protection layer 132 is a high-molecular layer (plastic film) or a diamond-like carbon (DLC) layer or is made of glass or the like.

When the electro-optical device 100 has the top emission structure, it is necessary that the protective layer 132 and the buffer layer 131 be translucent. However, when the electro-optical device 100 has the bottom emission structure, it is not necessary that the protective layer 132 and the buffer layer 131 be translucent.

When the protective layer 132 is formed above the gas barrier layer 40, the protective layer 132 has at least one of the following properties: the pressure resistance; the abrasion resistance; the property of preventing reflection of external light; the gas barrier property; the ultraviolet shielding property; and the like. Thus, the functional layer 25, the cathode 27 and the bas barrier layer 40 are protected by the protective layer 132, and the lifetimes of the light emitting elements 30 can be increased.

In addition, the buffer function 131 exhibits the buffering function of absorbing mechanical shock. Thus, when mechanical shock is applied from the outside, the buffer layer 131 can reduce the mechanical shock to be applied to the gas barrier layer 40 and the light emitting elements 30 (located on the inner side of the gas barrier layer 40) and prevent functions of the light emitting elements 30 from being degraded.

Second Embodiment

Electronic Device

Next, an electronic device according to a second embodiment of the invention is described with reference to FIGS. 9A to 9C.

Figure 9A:
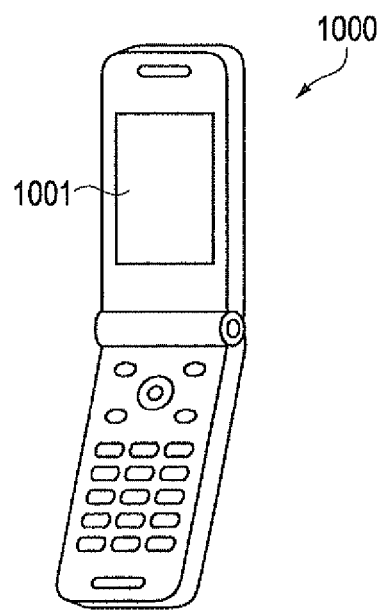
FIGS. 9A to 9C are perspective views of examples of an electronic device.

FIG. 9A is a perspective view of a mobile phone that serves as the electronic device. As shown in FIG. 9A, the mobile phone 1000 that is an example of the electronic device has a display unit 1001 arranged on a part of a foldable body of the mobile phone 1000. The display unit 1001 includes the electro-optical device 100 according to the first embodiment.

Figure 9B:
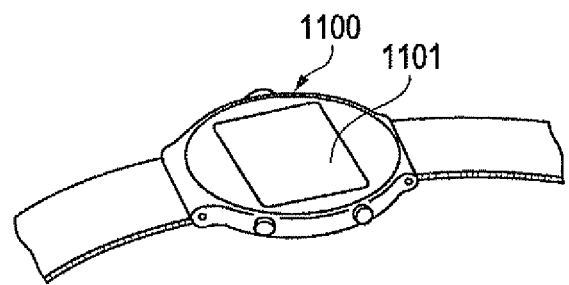

FIG. 9B is a perspective view of a wristwatch-type information terminal that serves as the electronic device. As shown in FIG. 9B, the wristwatch-type information terminal 1100 that is an example of the electronic device has a display unit 1101 arranged on a body of the wristwatch-type information terminal 1100. A belt is attached to the body of the wristwatch-type information terminal 1100. The display unit 1101 includes the electro-optical device 100 according to the first embodiment.

Figure 9C:
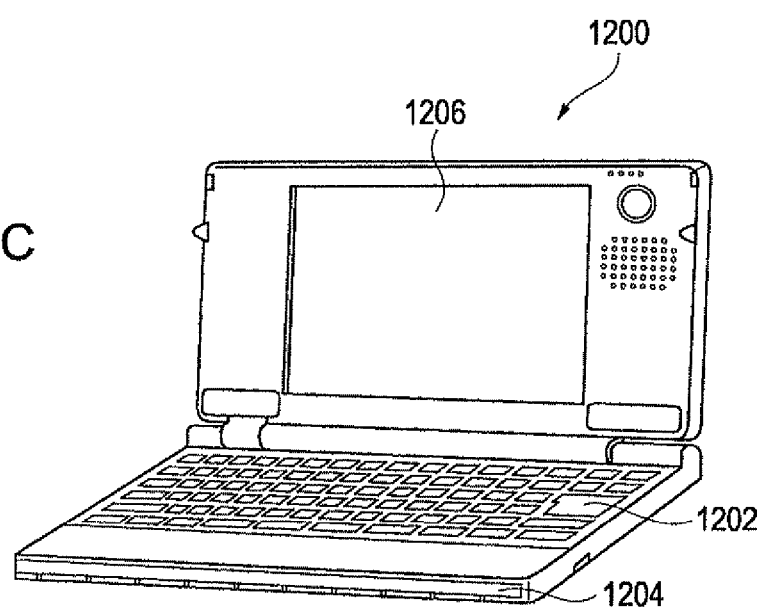

FIG. 9C is a perspective view of a portable information processing device that serves as the electronic device. As shown in FIG. 9C, the portable information processing device 1200 that is an example of the electronic device has a body 1204 that includes a keyboard 1202. The portable information processing device 1200 also has a display unit 1206. The display unit 1206 can be folded so that the display unit 1206 overlaps the body 1204. The display unit 1206 includes the electro-optical device 100 according to the first embodiment.

The electronic devices shown in FIGS. 9A to 9C each include the electro-optical device 100 in the display unit of the device in which the frame region 109 can be narrowed.

Thus, the electronic devices shown in FIGS. 9A to 9C can be formed in a compact shape. Therefore, the electronic devices have an excellent portability.

Various modified examples other than the aforementioned embodiments can be considered. The modified examples are described below.

First Modified Example

The planar arrangement of the connecting sections 105 that are included in the electro-optical device 100 according to the first embodiment is not limited to the aforementioned arrangement. In the first embodiment, the pair of connecting sections 105 are arranged in X direction so that the pixel region 107 is arranged between the connecting sections 105 as shown in FIG. 1. However, the connecting sections 105 may overlap at least one of the connecting lines 106 in the planar view. In this structure, a central line of the electro-optical device 100 in the planar view is shifted from a central line of the pixel region 107 in the planar view in X direction. In this case, however, the size of the frame region located outside the pixel region 107 can be reduced.

Figure 10:
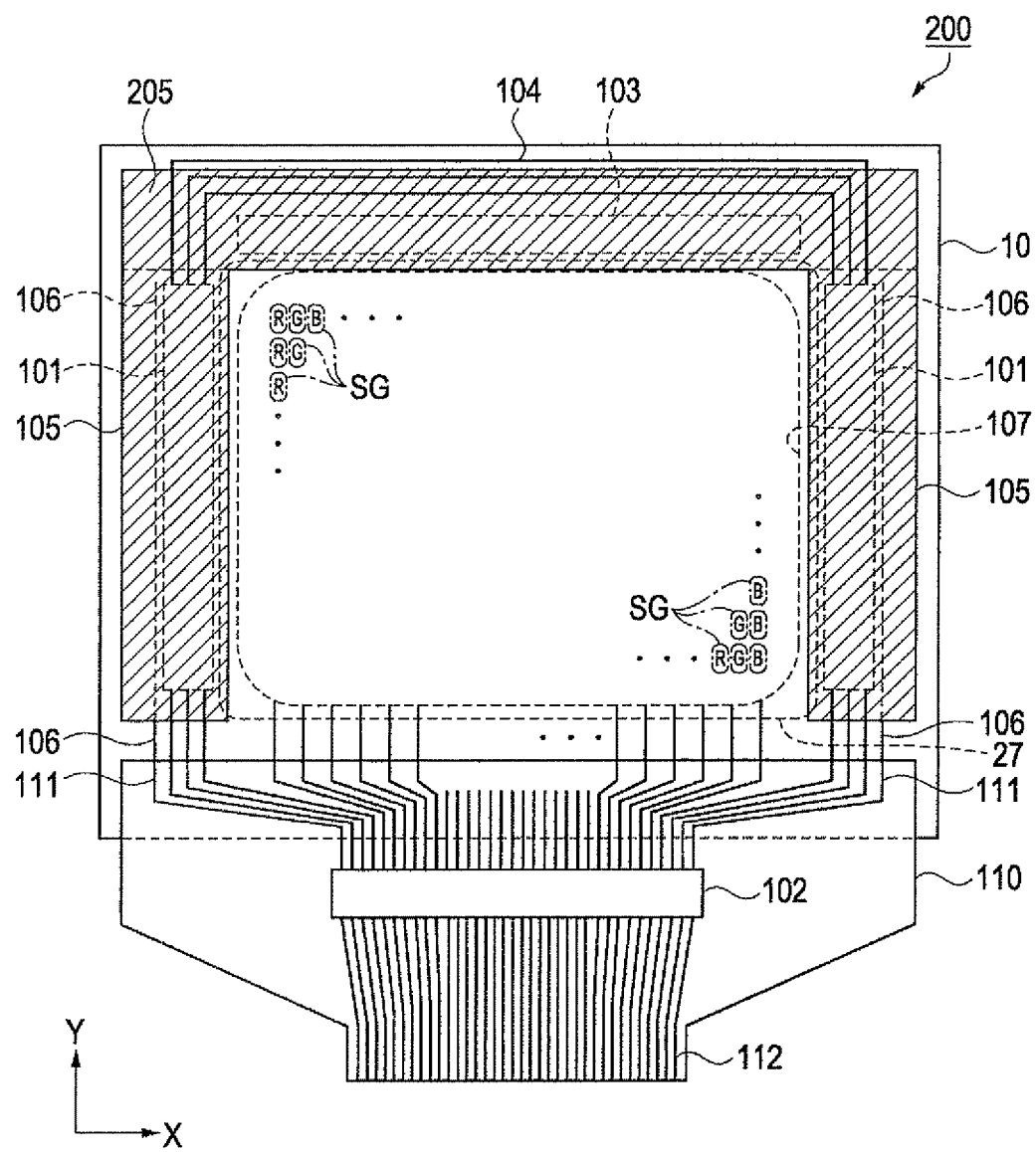
FIG. 10 is an outline plan view of an electro-optical device according to a first modified example.

FIG. 10 is an outline plan view of an electro-optical device according to a first modified example. As shown in FIG. 10, an electro-optical device 200 according to the first modified example has a connecting section 205 that overlaps the inspecting circuit 103 located outside the pixel region 107 in the planar view and extends between the pair of connecting sections 105, compared with the electro-optical device 100 according to the first and second embodiments. When the cathode 27 is formed and overlaps the connecting section 205, electrical resistance of the cathode 27 that covers the pixel region 107 can be reduced and a variation of light emitted by the light emitting elements 30 can be reduced by the electrical resistance of the cathode 27.

Second Modified Example

Figure 11:
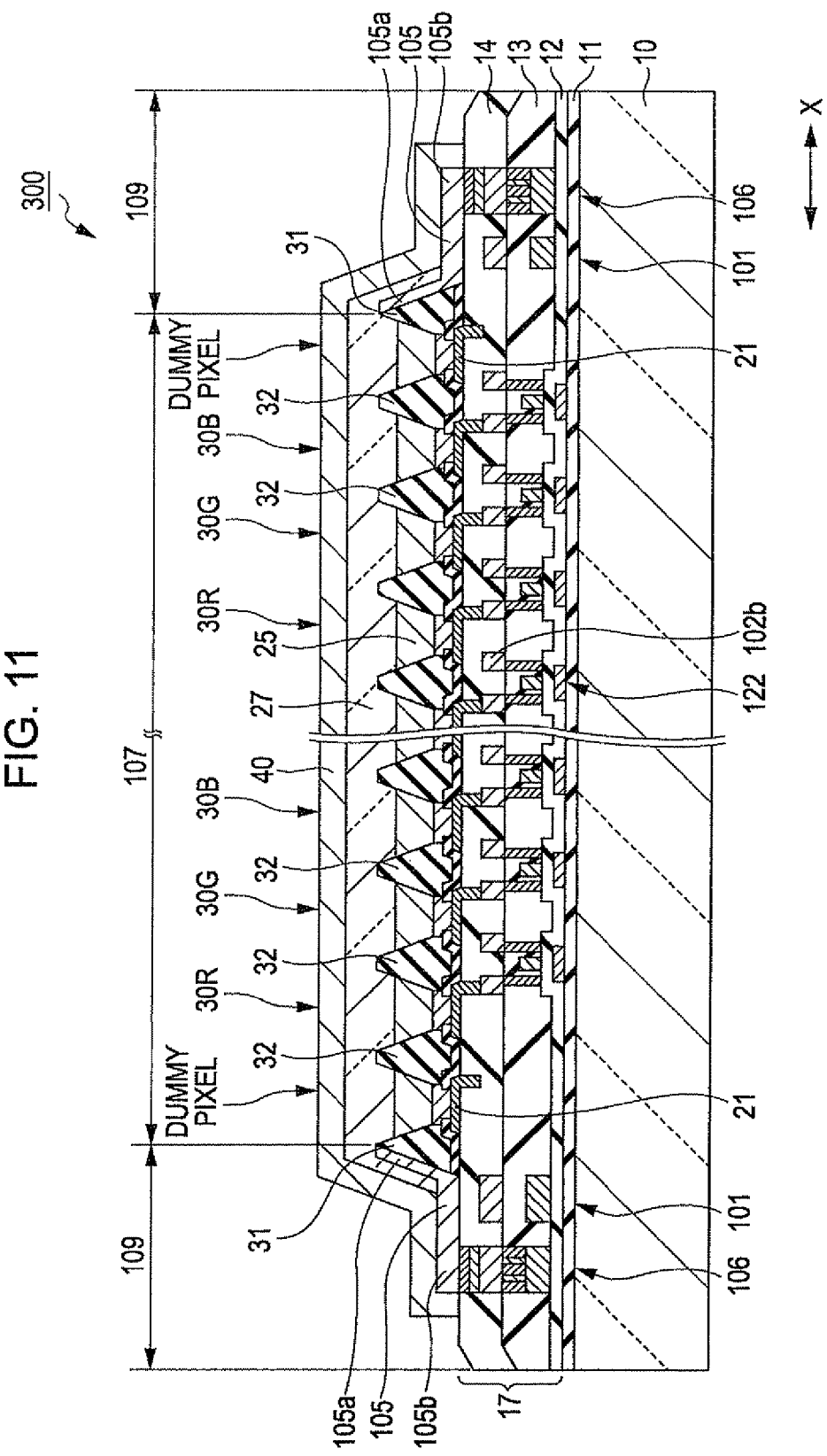
FIG. 11 is an outline plan view of an electro-optical device according to a second modified example.

The configuration of the pixel region 107 included in the electro-optical device 100 according to the first embodiment is not limited to the aforementioned configuration. FIG. 11 is an outline cross-sectional view of an electro-optical device according to a second embodiment example. As shown in FIG. 11, the electro-optical device 300 according to the second modified example has a dummy pixel that is located in a circumferential edge part of the pixel region 107 and does not contribute to actual displaying. The dummy pixel includes the pixel electrode 21, the cathode 27 and the functional layer 25 formed between the pixel electrode 21 and the cathode 27 in the same manner as the sub-pixels SG. However, the pixel electrode 21 of the dummy pixel is not electrically connected to the driving TFT 122. The first edge portion 105a of the connecting section 105 is formed on the partition wall portion 31 located on the outer side of the dummy pixel. The dummy pixel suppresses an influence of a variation in a part (located at the circumferential edge part) of the functional layer 25 (formed using the droplet discharging method or the mask deposition method) on the sub-pixels SG (to be used for actual displaying) and can achieve a high quality of displaying with less variation in luminance.

Third Modified Example

The electro-optical device 100 according to the first embodiment, which has the protective layer 132, is not limited to the aforementioned configuration. For example, a sealing member that bonds the protective layer 132 to the element substrate 10 may be arranged in the frame region 109 so that the sealing member seals the buffer layer 131 and supports the protective layer 132. This structure can reduce the amounts of oxygen and moisture that flow into the electro-optical device 100 from an outer circumferential portion of the electro-optical device 100.

Fourth Modified Example

The electro-optical device 100 according to the first embodiment is not limited to the aforementioned configuration. For example, the colors of light emitted by the light emitting elements 30 are not limited to the three colors, red (R), green (G) and blue (B). The light emitting elements 30 may emit only white light or light of another color. This structure can be used not only for display of information using light of a single color but also for an illumination device. With this structure in which the light emitting elements 30 emit white light, the protective layer 132 may be made of transparent glass or the like, and red, green and blue color filters may be arranged between the protective layer 132 and the light emitting elements 30 and correspond to the planar arrangement of the light emitting elements 30 so that full color display can be achieved.

Fifth Modified Example

The electronic devices in which the electro-optical device 100 according to the first embodiment can be installed are not limited to the mobile phone 1000, the wristwatch-type information terminal 1100 and the portable information processing device 1200. For example, examples of the electronic device are a digital camera, a digital video camera, a DVD viewer, an in-car display such as a car navigation device, an electronic notebook, a POS terminal, and an electronic advertising medium called a digital signage.

This application claims priority from Japanese Patent Application No. 2010-101773 filed in the Japanese Patent Office on Apr. 27, 2010, the entire disclosure of which is hereby incorporated by reference in its entirely.

What is claimed is:
1. An electro-optical device comprising:
a substrate that has a first region and a second region outside the first region;
light emitting element that is formed above the substrate in the first region, the light emitting element having a first electrode, a second electrode, and a light emitting layer formed between the first electrode and the second electrode;
a partition wall portion that is formed above the substrate in the second region;
a connecting line that is formed above the substrate in an outer side of the partition wall portion; and
a connecting section that is formed above the substrate and electrically connects the second electrode to the connecting line,
wherein the second electrode covers and extends over a pixel region including a light emitting element, the partition wall portion and the connecting section, the second electrode does not overlap the connecting line in a planar view, and the connecting section is disposed between the second electrode and the partition wall.
2. The electro-optical device according to claim 1,
wherein the partition wall portion includes an outer part that has a side surface that faces toward an outer circumference of the substrate, and wherein the second electrode overlaps the connecting section on the outer part of the partition wall portion in the planar view.

3. An electronic device comprising the electro-optical device according to claim 2.

4. The electro-optical device according to claim 1, further comprising a peripheral circuit that is arranged between the connecting line and the pixel region in the planar view and drives and controls the light emitting element,
wherein at least a part of the connecting section overlaps the peripheral circuit in the planar view.

5. An electronic device comprising the electro-optical device according to claim 4.

6. The electro-optical device according to claim 1,
wherein the connecting line and the connecting section extend along a first side of the substrate and a second side of the substrate, the first and second sides of the substrate forming an outer circumference of the substrate and facing each other.

7. The electro-optical device according to claim 1,
wherein the connecting section is made of a conductive material and the second electrode is made of a conductive material that is different from the conductive material of the connecting section.

8. The electro-optical device according to claim 7,
wherein specific resistance of the connecting section is smaller than specific resistance of the second electrode.

9. The electro-optical device according to claim 1, further comprising a gas barrier layer that covers the second electrode and the connecting section.

10. An electronic device comprising the electro-optical device according to claim 1.

11. A method for manufacturing an electro-optical device that includes a substrate that has a first region and a second region outside the first region, a light emitting element that is formed above the substrate in the first region, the light emitting element having a first electrode, a second electrode, and a light emitting layer arranged between the first electrode and the second electrode, comprising:
forming a partition wall portion above the substrate in the second region;
forming a connecting line above the substrate in an outer side of the partition wall portion;
forming a connecting section above the substrate, the connecting section electrically connects the second electrode to the connecting line; and
forming the second electrode so that the second electrode covers and extends over a pixel region including the light emitting element, the partition wall portion and the connection section, the second electrode does not overlap the connecting line in a planar view, and the connecting section is disposed between the second electrode and the partition wall.

12. The method according to claim 11,
wherein the connecting section is formed using a photolithographic method, and
wherein the second electrode is formed using a mask deposition method.

13. An electronic device comprising the electro-optical device manufactured using the method according to claim 12.

14. The method according to claim 11,
wherein the partition wall portion includes an outer part that has a side surface that faces toward an outer circumference of the substrate,
wherein the connecting section is formed and extends from the connecting line to the outer part of the partition wall portion in the planar view, and
wherein the second electrode is formed and overlaps the connecting section on the outer part of the partition wall portion in the planar view.

15. An electronic device comprising the electro-optical device manufactured using the method according to claim 14.

16. The method according to claim 11,
wherein the connecting section is made of a conductive material, and the second electrode is made of a conductive material that is different from the conductive material of the connecting section.

17. The method according to claim 16,
wherein the connecting section is made of the conductive material with lower specific resistance than the conductive material of the second electrode.

18. The method according to claim 11, further comprising forming a peripheral circuit that is arranged between the connecting line and the pixel region in the planar view and drives and controls the light emitting element,
wherein the connecting section is formed so that at least a part of the connecting section overlaps the peripheral circuit in the planar view.

19. The method according to claim 11, further comprising forming a gas barrier layer that covers the second electrode and the connecting section.

20. An electronic device comprising the electro-optical device manufactured using the method according to claim 11.

* * * * *